United States Patent
Huang et al.

(10) Patent No.: US 9,147,612 B2
(45) Date of Patent: Sep. 29, 2015

(54) METHOD FOR FORMING A SEMICONDUCTOR STRUCTURE

(71) Applicant: UNITED MICROELECTRONICS CORP., Hsin-Chu (TW)

(72) Inventors: Po-Cheng Huang, Kaohsiung (TW); I-Ming Tseng, Kaohsiung (TW); Yu-Ting Li, Chiayi (TW); Chun-Hsiung Wang, Kaohsiung (TW); Wu-Sian Sie, Tainan (TW); Yi-Liang Liu, Tainan (TW); Chia-Lin Hsu, Tainan (TW); Po-Chao Tsao, New Taipei (TW); Chien-Ting Lin, Hsinchu (TW); Shih-Fang Tzou, Tainan (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 1 day.

(21) Appl. No.: 14/088,445

(22) Filed: Nov. 25, 2013

(65) Prior Publication Data
US 2015/0147874 A1    May 28, 2015

(51) Int. Cl.
*H01L 21/338* (2006.01)
*H01L 21/8234* (2006.01)
*H01L 21/265* (2006.01)

(52) U.S. Cl.
CPC ...... *H01L 21/823431* (2013.01); *H01L 21/265* (2013.01)

(58) Field of Classification Search
CPC ............... H01L 29/66848; H01L 21/823431; H01L 21/265
USPC ........................................ 438/176, 183, 283
See application file for complete search history.

(56) References Cited

U.S. PATENT DOCUMENTS

2006/0275988 A1* 12/2006 Yagishita et al. ............ 438/275
2013/0309838 A1* 11/2013 Wei et al. .................... 438/424
2013/0330889 A1* 12/2013 Yin et al. ..................... 438/197

OTHER PUBLICATIONS

Tsao, Title of Invention: Method of Forming Fin-Shaped Structure, U.S. Appl. No. 13/902,970, filed May 27, 2013.

* cited by examiner

*Primary Examiner* — Bradley K Smith
(74) *Attorney, Agent, or Firm* — Winston Hsu; Scott Margo

(57) ABSTRACT

The present invention provides a manufacturing method for forming a semiconductor structure, in which first, a substrate is provided, a hard mask is disposed on the substrate, the hard mask is then patterned to form a plurality of fin hard masks and a plurality of dummy fin hard masks, afterwards, a pattern transferring process is performed, to transfer the patterns of the fin hard masks and the fin hard masks into the substrate, so as to form a plurality of fin groups and a plurality of dummy fins. Each dummy fin is disposed on the end side of one fin group, and a fin cut process is performed, to remove each dummy fin.

9 Claims, 7 Drawing Sheets

METHOD FOR FORMING A SEMICONDUCTOR STRUCTURE

BACKGROUND OF THE INVENTION

1. Field of the Invention

The present invention relates to a manufacturing method for forming a semiconductor structure, in particular, to a method for forming a semiconductor structure with dummy fins which can protect other fins from damages.

2. Description of the Prior Art

With increasing miniaturization of semiconductor devices, various Multi-gate MOSFET devices have been developed. The Multi-gate MOSFET is advantageous for the following reasons. Manufacturing processes of Multi-gate MOSFET devices can be integrated into traditional logic device processes, and thus are more compatible. In addition, since the three-dimensional structure of the Multi-gate MOSFET increases the overlapping area between the gate and the substrate, the channel region is controlled more effectively. This reduces both the drain-induced barrier lowering (DIBL) effect and the short channel effect. Moreover, as the channel region is longer for the same gate length, the current between the source and the drain is increased.

A multi-gate MOSFET has a gate formed on fin-shaped structures, and the fin-shaped structures are formed on a substrate, wherein the fin-shaped structures formed by etching the substrate are strip structures parallel to each other. With the demands of miniaturization of semiconductor devices, the width of each fin-shaped structure narrows and the spacing between the fin-shaped structures shrinks. Thus, forming fin-shaped structures which can achieve the required demands under the restrictions of miniaturization, physical limitations and various processing parameters becomes an extreme challenge.

SUMMARY OF THE INVENTION

The present invention provides a manufacturing method for forming a semiconductor structure, comprising the following steps: first, a substrate is provided, a hard mask is disposed on the substrate, the hard mask is then patterned to form a plurality of fin hard masks and a plurality of dummy fin hard masks, afterwards, a pattern transferring process is performed, to transfer the patterns of the fin hard masks and the fin hard masks into the substrate, so as to form a plurality of fin groups and a plurality of dummy fins, wherein each dummy fin is disposed on the end side of one fin group, and a fin cut process is performed, to remove each dummy fin.

The present invention further provides a manufacturing method for forming a semiconductor structure, comprising the following steps: first, a substrate is provided, a hard mask is disposed on the substrate, the hard mask is then patterned to form a plurality of fin hard masks and a plurality of dummy fin hard masks, afterwards, a pattern transferring process is performed, to transfer the patterns of the fin hard masks and the fin hard masks into the substrate, so as to form a plurality of fin groups and a plurality of dummy fins, wherein each dummy fin is disposed on the end side of one fin group, and an ion implantation process is performed on the fin groups, the dummy fins and the substrate.

The present invention provides a manufacturing process for forming a semiconductor structure. In this semiconductor structure, besides comprising the fin groups disposed on the substrate, the semiconductor structure further comprises a plurality of dummy fins disposed on the end side of the fin group. The dummy fin can help to protect the fin groups from damages. In this way, the fin groups may avoid damages easily, and the quality of the semiconductor devices can be further increased.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
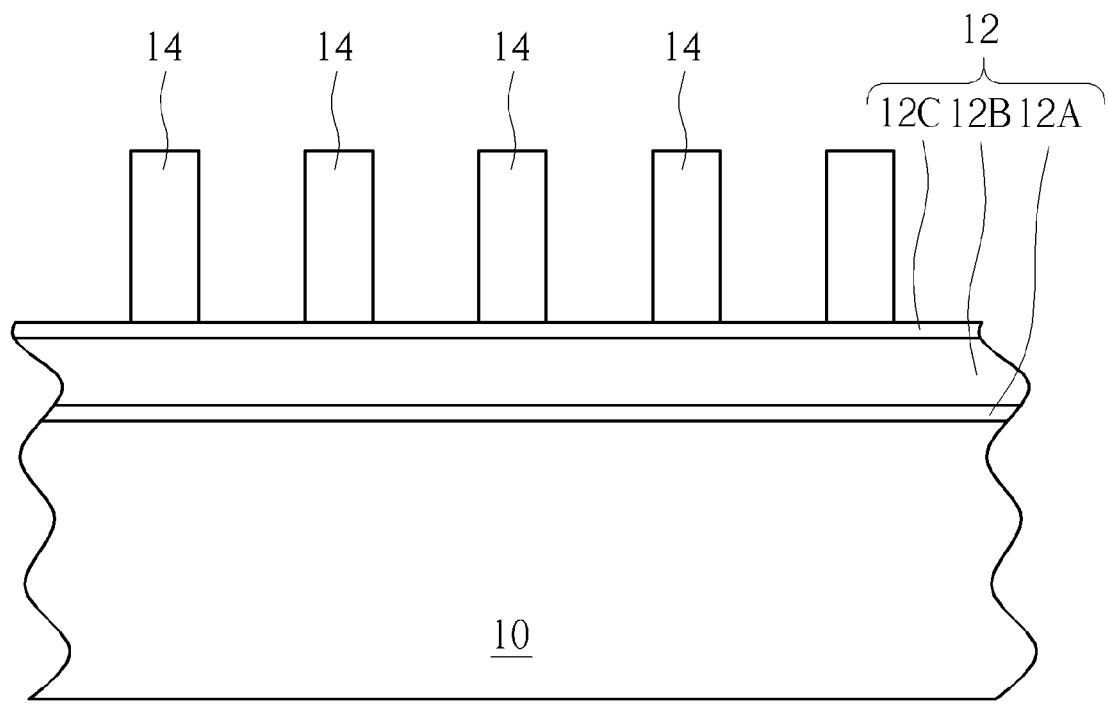
FIGS. 1-8 are schematic diagrams showing the method for forming the semiconductor structure according to the first preferred embodiment of the present invention.
Figure 2:
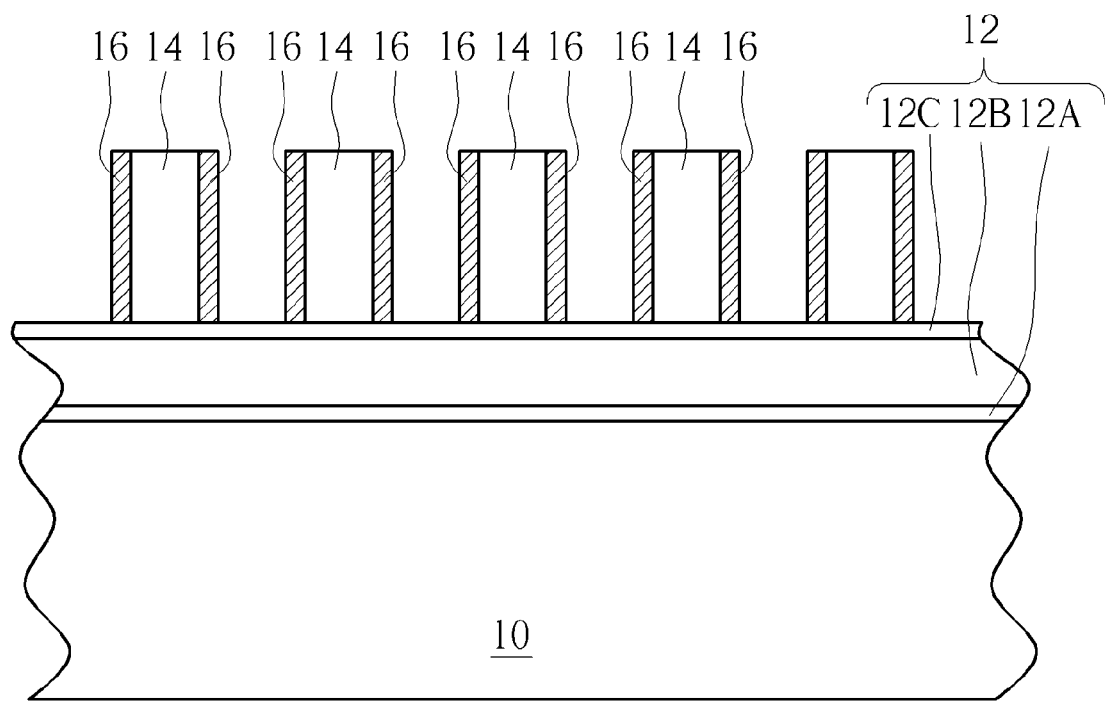
Figure 3:
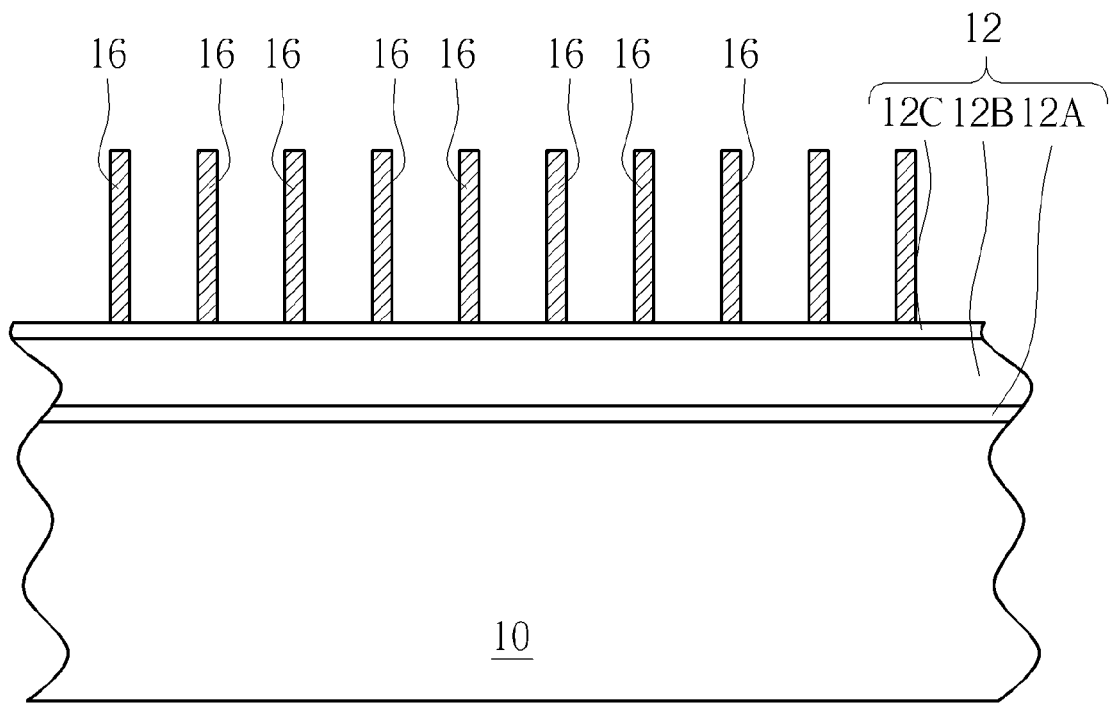

FIGS. 1-8 are schematic diagrams showing the method for forming the semiconductor structure according to the first preferred embodiment of the present invention. As shown in FIGS. 1-3, a plurality of spacers 16 is formed on a substrate 10. More precisely, as shown in FIG. 1, a substrate 10 is provided. The substrate 10 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A hard mask layer 12 is formed on the substrate 10, wherein the hard mask layer 12 may be a single layer structure or a multiple layer structure, the material of the hard mask layer comprises silicon oxide or silicon nitride, but not limited thereto. In this embodiment, the hard mask layer is a tri-layer structure, including a lower hard mask layer 12A consisting of silicon oxide, a middle hard mask layer 12B consisting of silicon nitride and an upper hard mask layer 12C consisting of silicon oxide, but not limited thereto.

A plurality of sacrificial patterns 14 are formed on the substrate 10. In this embodiment, the method of forming the sacrificial patterns 14 is integrated into a gate process. For example, a gate process can be performed to form a plurality of sacrificial gates which serve as the sacrificial patterns 14 on the substrate 10, but it is not limited thereto. In one case, the sacrificial patterns 14 are polysilicon gates, but the material is not restricted therein.

Afterwards, as shown in FIG. 2, a plurality of spacers 16 is formed on the substrate 10 next to the sacrificial patterns 14. More precisely, a spacer material (not shown) conformally covers the sacrificial patterns 14 and the substrate 10, and the spacer material is then etched to form the spacers 16. This step can be integrated into a gate process. The spacers 16 may be nitride spacers, but are not limited thereto. The spacer 16 maybe composed of materials having etching selectivity to the material of the sacrificial patterns 14, and the spacers 16 may be composed of multi dielectric layers.

As shown in FIG. 3, the sacrificial patterns are then removed, so the spacers 16 remain on the substrate 10 and the parts of the substrate 10 directly below the sacrificial patterns 14 are exposed.

Figure 4:
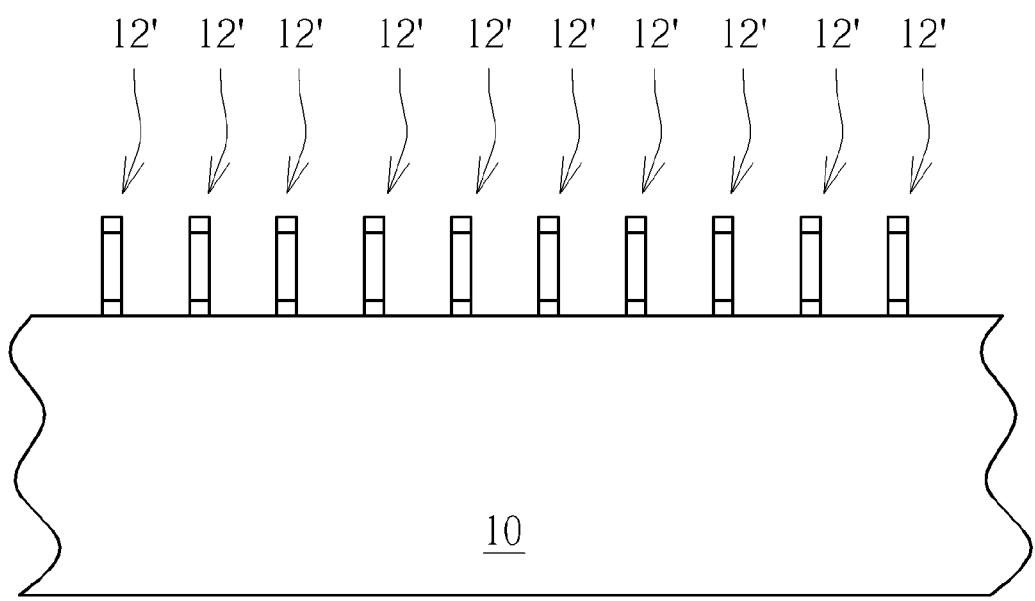
Figure 5:
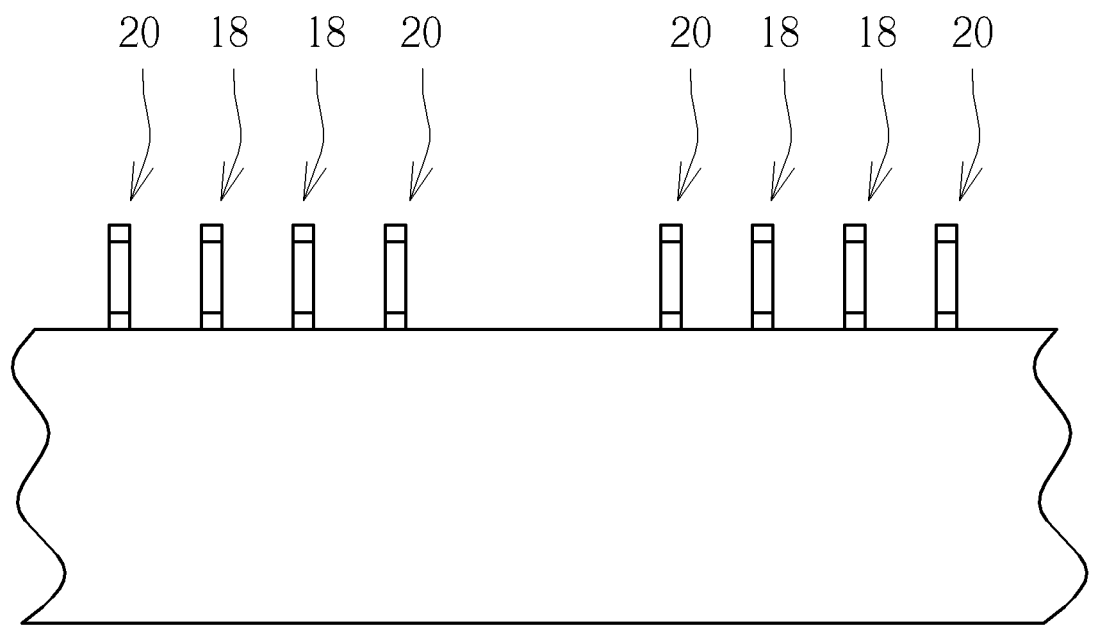

As shown in FIG. 4, a pattern transferring process is then performed, so that the pattern of the spacers 16 is transferred to hard mask layer 12 to form a plurality of patterned hard mask 12'. For instance, an etching process (not shown) is performed to etch the hard mask layer 12 by using the spacers 16 to serve as hard masks; thereby, the plurality of patterned hard mask 12' are formed on the substrate 10. The method using the spacer serve as the hard mask called the "sidewall image transfer" (SIT) process. The etching process may be a dry etching process, a wet etching process, or a sequentially performed dry and wet etching process, etc. In this embodiment, since the hard mask layer 12 is a tri-layer structure, each patterned hard mask 12' comprises a silicon nitride layer disposed between two silicon oxide layers, but not limited thereto. In another case, parts of each patterned hard mask may be consumed (removed) during the pattern transferring process, so each of the patterned hard masks may be a single layer structure or a multiple layer structure.

Afterwards, in order to form a desired layout of the fins which are formed in the following steps, a cutting process is then performed, to remove parts of the patterned hard mask 12'. In this step, if each patterned hard mask is a rectangular ring shaped structure viewed in top view, parts of the patterned hard mask 12', in particular, the connecting portion between two edges of the rectangular ring, can be removed, to isolate the patterned hard mask 12' from each other. In addition, some patterned hard masks 12' are removed, which distinguishes these patterned hard masks 12' into different regions. The remaining patterned hard masks 12' comprise two different types: one is the fin hard mask 18; another is the dummy fin hard mask 20, wherein each fin hard mask 18 is disposed corresponding to the layout of the semiconductor device, and each dummy fin hard mask 20 is disposed beside the fin hard masks 18. In other words, in this embodiment, a plurality of fin hard masks 18 can be deemed as a "group", and the group is disposed between two dummy fin hard masks 20.

Figure 6:
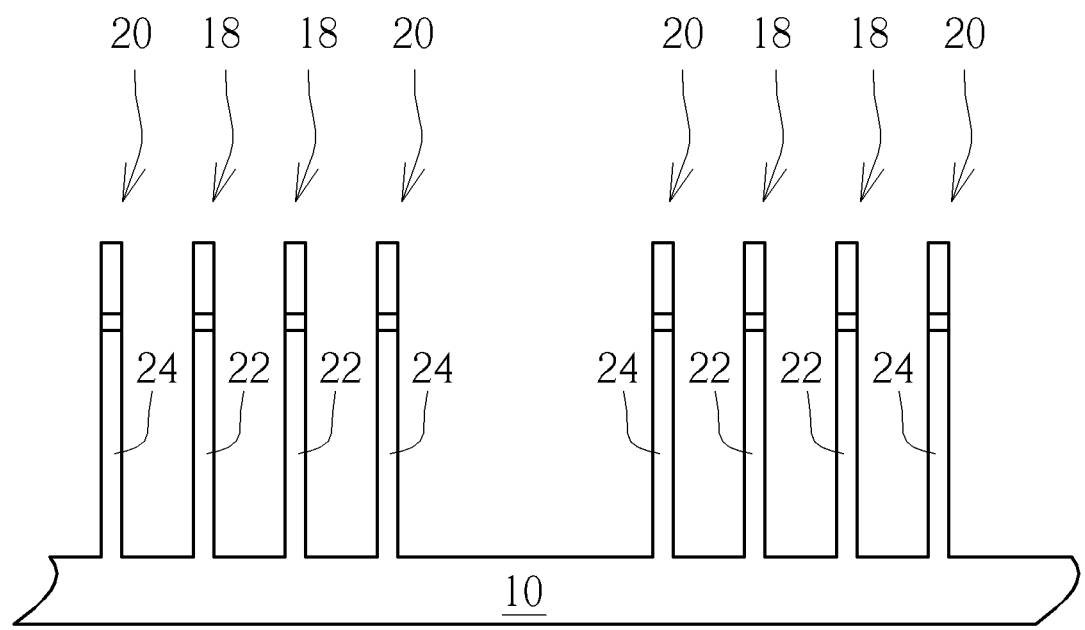

As shown in FIG. 6, an etching process is performed, to transfer the pattern of each fin hard mask 18 and each dummy pattern hard mask 20 into the substrate 10 disposed below, so as to form a plurality of fin groups 22 and a plurality of dummy fins 24, wherein each fin group 22 includes at least one fin structure disposed adjacent to each other, and each dummy fin is disposed on the end side of one fin group. In other words, every fin group 22 is disposed between two dummy fins 24. In this embodiment, the fin hard mask 18 and the dummy fin hard mask 20 may remain on the fin groups and on the dummy fins respectively, but not limited thereto. Since the fin hard mask 18 and the dummy fin hard mask 20 may be consumed during the etching process, in another case the fin groups 22 and the dummy fins do not comprise the fin hard mask 18 and the dummy fin hard mask 20 disposed thereon. However, parts of the fin hard mask 18 and the dummy fin hard mask 20 preferably remain to protect the fin groups and the dummy fins.

In the conventional processes, during the steps from the cutting process to the formation of the fin (corresponding to the processes shown in FIG. 5-6 of the present invention), some deviations can easily occur to the "end fin" which is disposed on the end side of these fin groups. For example, since the one fin is disposed nearest to the edge of the etched region, the fin is easily damaged by the etching process, affecting the critical dimension of the fin, and further influencing the performance of the completed semiconductor device.

In order to resolve the issues mentioned above, in this embodiment, the dummy fins 24 are disposed on the end side of the fin groups 22, to protect the fin groups 22 from the damages, such as that occurring during the etching process, the cutting process, the ion implantation process or others. In the present invention, the difference between the fin group 22 and the dummy fin 24 is that the fin groups 22 will electrically connect to another semiconductor devices in the following process through a trace, a plug or others suitable methods, but the dummy fins 24 will not electrically connect to any semiconductor devices in the following process. In other words, the dummy fins 24 can be deemed as a "floating device", and which are electrically isolated from other semiconductor devices.

After the fin groups 22 and the dummy fin 24 are formed, an ion implantation process (not shown) can selectively be performed on the substrate 10, the fin groups 22 and the dummy fins 24. In this case, the dummy fins 24 disposed on the end side of the fin groups 22, therefore, the dummy fins 24 can protect the fin groups 22, avoiding the influences caused by the ion implantation process (such as the high temperature during the process) too.

Figure 7:
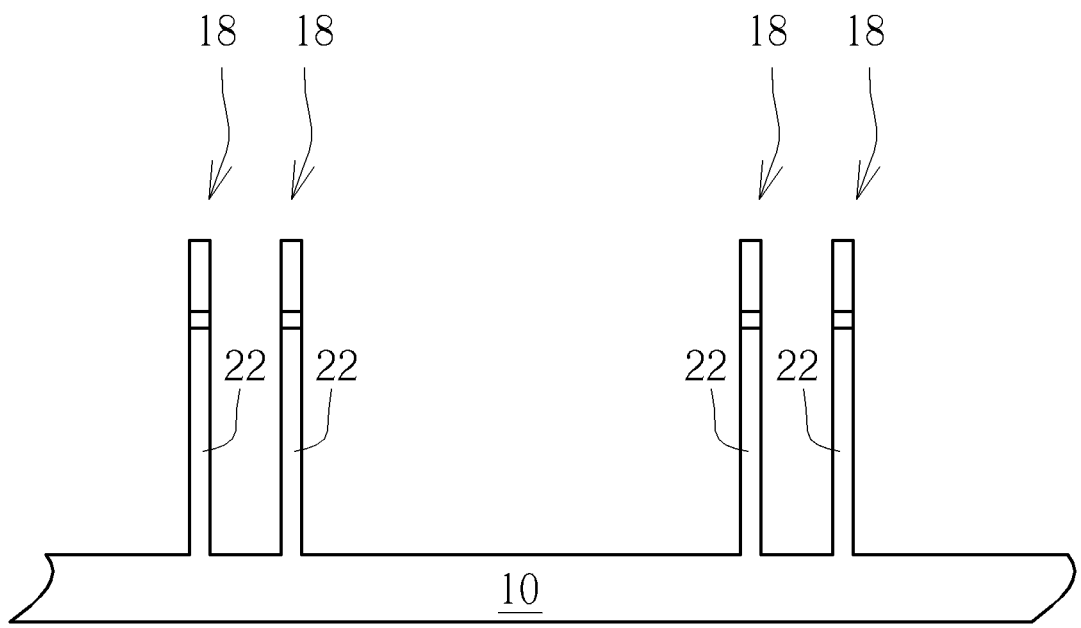
Figure 8:
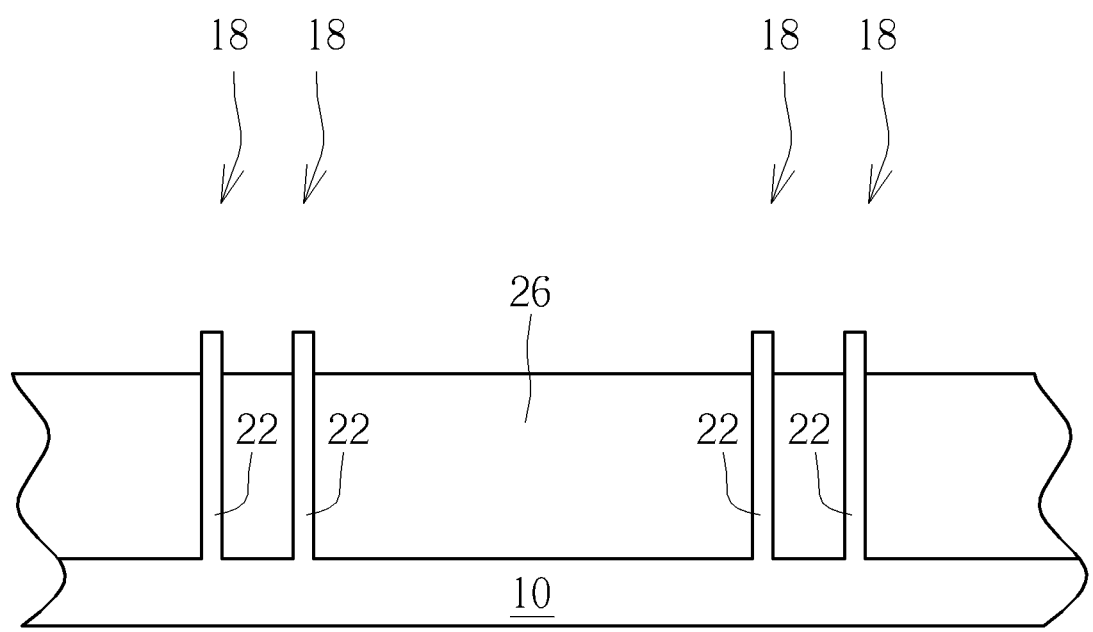

As shown in FIG. 7, the dummy fins 24 are then removed, such as through a lithography process and an etching process, and as shown in FIG. 8, an oxide layer 26 is formed on the substrate 10, a planarization process such as a chemical mechanical planarization (CMP) is then performed to remove parts of the oxide layer 26, and finally, an etching back process is performed, to remove parts of the oxide layer and parts of the fin hard mask 18, so as to expose parts of the fin group 22. The planarization process and the etching back process are well known to persons of ordinary skills in the art and the details will not be described here.

The following description will detail the different embodiments of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
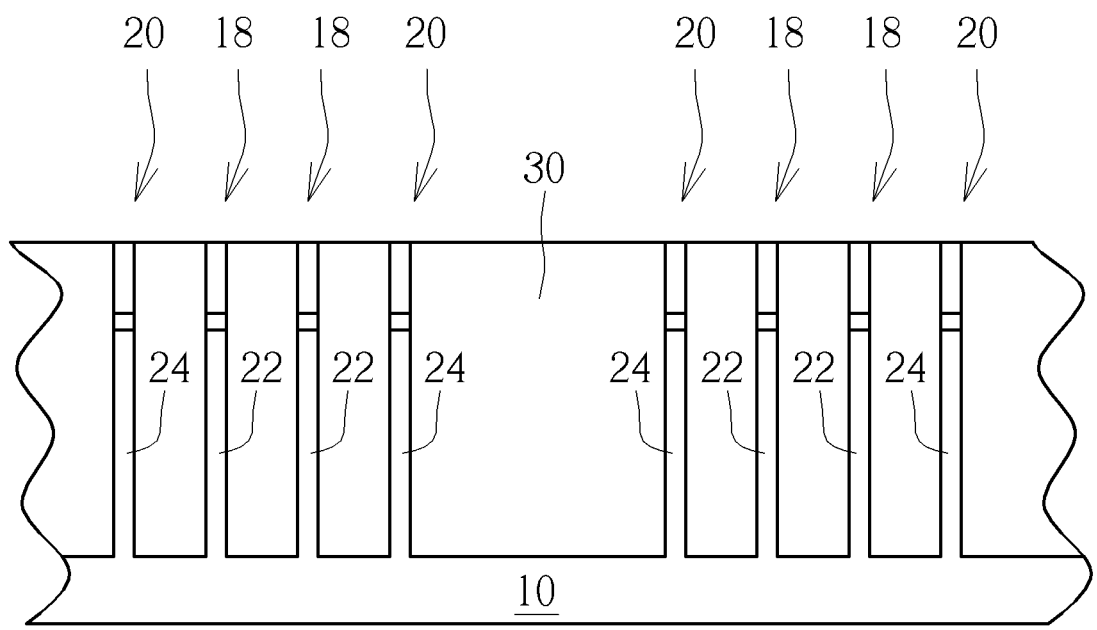
FIGS. 9-10 are schematic diagrams showing the method for forming the semiconductor structure according to the second preferred embodiment of the present invention.

The second preferred embodiment of the present has the same steps as those shown in FIGS. 1-6., After the fin groups 22 and the dummy fins 24 are formed (as shown in FIG. 6), please refer to FIG. 9. An oxide layer 30 is formed on the substrate 10, to cover each fin group 22 and on each dummy fin 24, and a planarization process such as a CMP process is then performed. It is worth noting that in this step, the dummy fins 24 still remain on the substrate 10.

Figure 10:
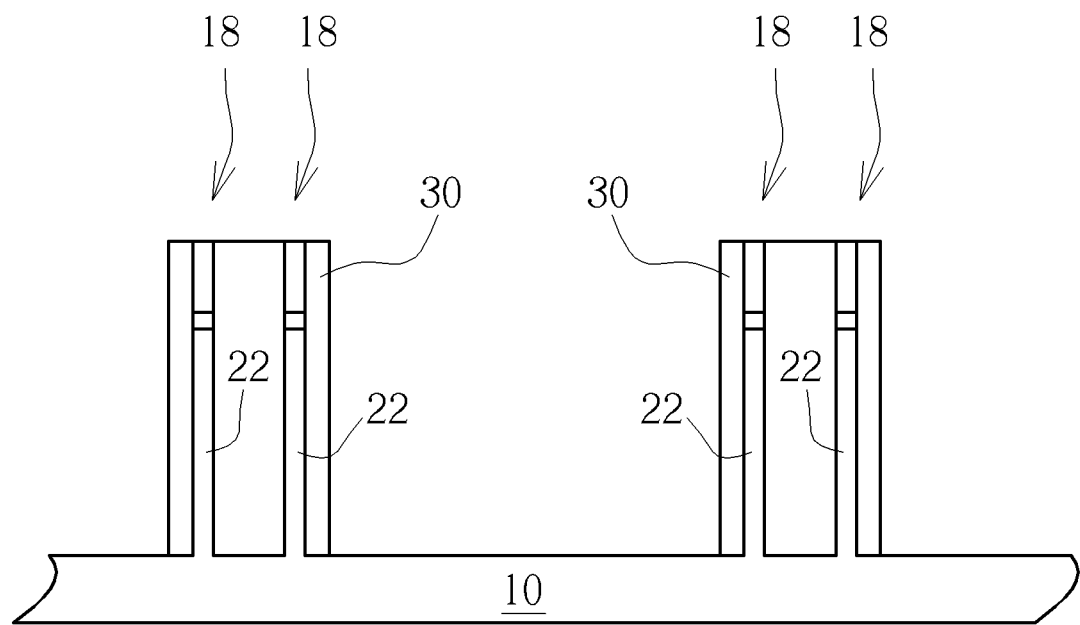

Afterwards, as shown in FIG. 10, an etching process is performed to remove the dummy fins 24 and parts of the oxide layer 30 simultaneously. The difference between this embodiment and the first preferred of the present is that the dummy fins 24 are removed after the oxide layer 30 is formed, the oxide layer 30 may protect the fin groups 22, avoiding damages from etching process while the dummy fins 24 are removed. Then, similar to the steps shown in FIG. 7-8, the oxide layer 26 is formed, and the planarization process and the etching back process are then performed in sequence. The final structure of the second embodiment is same as the structure shown in FIG. 8. The other components, material properties, and manufacturing method of this embodiment are similar to the first preferred embodiment detailed above and will not be redundantly described.

Figure 11:
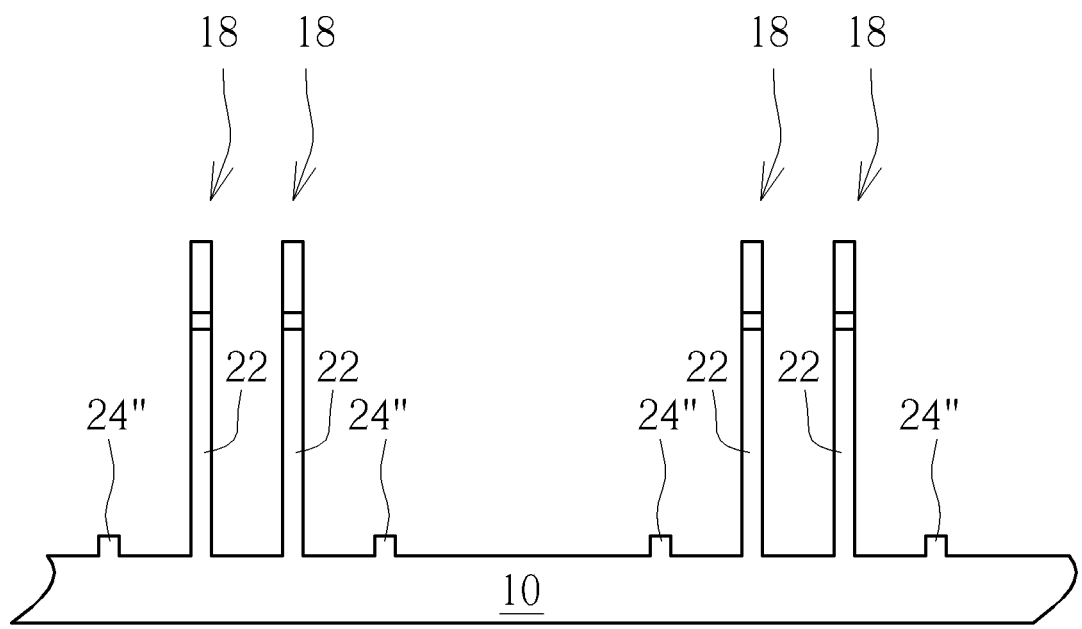
FIG. 11 is schematic diagram showing the semiconductor structure according to another case of the present invention.

Besides, in another case, the dummy fins 24 are partially removed, such that the top surface of the substrate 10 and the top surface of the remaining dummy fins are not on a same level. More precisely, in the first preferred embodiment and the second preferred embodiment mentioned above, the dummy fins are completely removed. However, the present invention is not limited thereto, in another embodiment of the present invention, as shown in FIG. 11, after the dummy fins are partially removed, there are still some portions of the dummy fin 24' remaining on the substrate 10, and the top surface of the remaining dummy fin 24' is higher than the top surface of the substrate 10, so the remaining dummy fin 24' looks like a small bump disposed on the substrate 10. In another case, the dummy fins 24 may be over-etched through an etching process. Therefore some small trenches (not shown) remain on the substrate 10, and the top surface of the remaining dummy fin 24' is lower than the top surface of the substrate 10. Preferably, the dummy fins 24 are not removed completely, and some "bumps" remain on the substrate, which can protect the fin groups 22 from etching or ion implantation damages.

Figure 12:
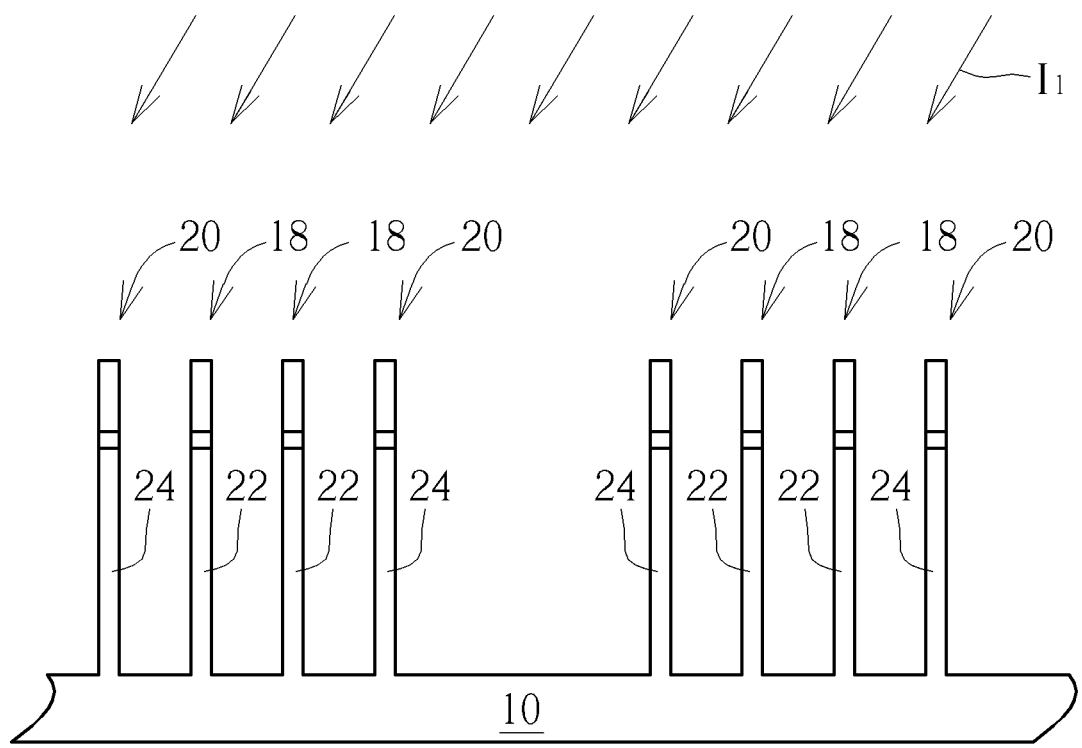
FIGS. 12-13 are schematic diagrams showing the method for forming the semiconductor structure according to the third preferred embodiment of the present invention.
Figure 13:
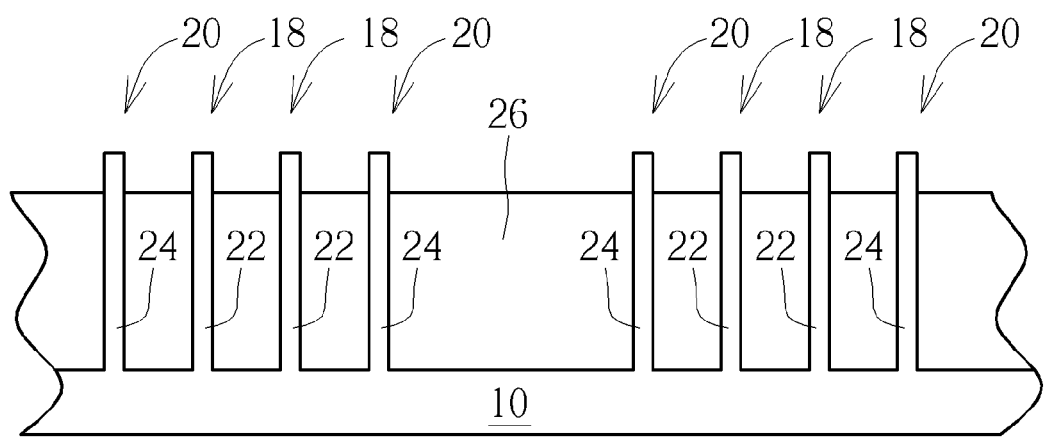

The third embodiment of the present invention has a similar process to those shown in FIGS. 1-6. Afterwards, as shown in FIGS. 12-13, the dummy fins 24 are not removed, but still remain on the substrate 10, and an implantation process I1 is then performed on the substrate 10, the dummy fins 24 and the fin groups 22. The other processes are similar to those of in the first preferred embodiment. The oxide layer 26 is formed, and the planarization process and the etching back process are then performed in sequence, and the final structure of the third embodiment is shown in FIG. 13. The other components, material properties, and manufacturing method of this embodiment are similar to the first preferred embodiment detailed above and will not be redundantly described.

The difference between the third preferred embodiment and the first preferred embodiment is in the third preferred embodiment, the dummy fins 24 are not removed, which still exist in the final structure (as shown in FIG. 13). Since in the present invention, the dummy fins 24 will not be electrically connected to other devices in the following process, so whether the dummy fins 24 are removed or not will not influence the completed semiconductor device. In addition, if the dummy fins 24 remain on the substrate, the dummy fins can also help to protect the fin groups 22 in the ion implantation process I1 too. Therefore, in the present invention, the dummy fin can selectively be removed according to actual requirements.

In summary, the present invention provides a manufacturing process for forming a semiconductor structure. In this semiconductor structure, besides comprising the fin groups disposed on the substrate, the semiconductor structure further comprises a plurality of dummy fins disposed on the end side of the fin group. The dummy fin can help to protect the fin groups from damages. In this way, the fin groups may avoid damages easily, and the quality of the semiconductor devices can be further increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for forming a semiconductor structure, comprising the following steps:
   providing a substrate, a hard mask being disposed on the substrate;
   patterning the hard mask to form a plurality of patterned hard masks;
   removing parts of the patterned hard masks entirely, and the remaining patterned hard masks includes a plurality of fin hard masks and a plurality of dummy fin hard masks;
   performing a pattern transferring process, to transfer the patterns of the fin hard masks and the dummy fin hard masks into the substrate, so as to form a plurality of fin groups and a plurality of dummy fins, wherein each dummy fin is disposed on the end side of one fin group; and
   performing a fin cut process to remove each dummy fin.

2. The method of claim 1, further comprising performing an oxide fill process before the dummy fins are removed, to cover an oxide layer on each fin group and on each dummy fin.

3. The method of claim 2, further comprising performing a planarization process, to remove parts of the oxide layer.

4. The method of claim 1, further comprising performing an ion implantation process on the dummy fins, the fin groups and the substrate.

5. The method of claim 1, wherein the method for forming the fin hard mask and the dummy fin hard mask comprises a sidewall image transfer process.

6. The method of claim 1, further comprising forming an oxide layer on each fin group after the dummy fins are removed, and then performing a planarization process.

7. The method of claim 6, further comprising performing an etching back process to expose parts of the fin groups.

8. The method of claim 1, wherein each fin group is electrically connected to a device, and each dummy fin is electrically isolated from the device.

9. The method of claim 1, wherein the dummy fins are partially removed, and the top surface of each dummy fin and the top surface of the substrate are not disposed on a same level.

* * * * *